US011411387B2

(12) United States Patent
Jain et al.

(10) Patent No.: US 11,411,387 B2
(45) Date of Patent: Aug. 9, 2022

(54) OVER/UNDER VOLTAGE DETECTION CIRCUIT

(71) Applicant: TEXAS INSTRUMENTS INCORPORATED, Dallas, TX (US)

(72) Inventors: Mayank Jain, Bengaluru (IN); Preetam Tadeparthy, Bengaluru (IN); Rohit Narula, Bengaluru (IN); Shobhit Singhal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 274 days.

(21) Appl. No.: 16/658,311

(22) Filed: Oct. 21, 2019

(65) Prior Publication Data

US 2021/0119435 A1  Apr. 22, 2021

(51) Int. Cl.
| | |
|---|---|
| *H02H 3/00* | (2006.01) |
| *H02H 3/20* | (2006.01) |
| *G06F 1/30* | (2006.01) |
| *H02H 1/00* | (2006.01) |
| *H03M 1/66* | (2006.01) |

(52) U.S. Cl.
CPC ............... *H02H 3/207* (2013.01); *G06F 1/30* (2013.01); *H02H 1/0007* (2013.01); *H03M 1/66* (2013.01)

(58) Field of Classification Search
CPC ................................... G06F 1/30; H02H 3/207
USPC .......................................................... 361/87
See application file for complete search history.

(56) References Cited

U.S. PATENT DOCUMENTS

| | | | | |
|---|---|---|---|---|
| 4,743,779 | A * | 5/1988 | Valley ................ | G01R 19/1659 327/68 |
| 8,624,653 | B2 * | 1/2014 | Nagda .............. | G01R 31/31703 327/307 |
| 2001/0045470 | A1 * | 11/2001 | Poucher ................. | G01K 3/005 236/94 |
| 2007/0083582 | A1 * | 4/2007 | Chambers ........... | G06F 13/4213 708/490 |
| 2010/0014203 | A1 * | 1/2010 | Teggatz ........... | G01R 19/16542 361/91.1 |
| 2016/0365822 | A1 * | 12/2016 | Tanabe .................... | H02P 29/02 |

* cited by examiner

*Primary Examiner* — Jared Fureman
*Assistant Examiner* — Lucy M Thomas
(74) *Attorney, Agent, or Firm* — Michael T. Gabrik; Charles A. Brill; Frank D. Cimino (57) ABSTRACT

An over/under voltage protection circuit includes a voltage input terminal, a digital-to analog converter, a comparator, and a control circuit. The comparator includes a first input coupled to an output of the digital-to-analog converter, and a second input coupled to the voltage input terminal. The control circuit includes an output coupled to an input of the digital-to-analog converter, and an input coupled to an output of the comparator. The control circuit is configured to set the digital-to-analog converter to generate an overvoltage fault threshold responsive to the output of the comparator indicating that voltage of a signal at the voltage input terminal exceeds a threshold currently generated by the digital-to-analog converter.

19 Claims, 5 Drawing Sheets

FIG. 8 ately to provide increased threshold setsurface the threshold response the threshold response the threshold response the threshold response the threshold response the threshold response the threshold response the threshold response the

OVER/UNDER VOLTAGE DETECTION CIRCUIT

BACKGROUND

Electronic devices are designed to operate with a range of power supply voltages between specified maximum and minimum voltages. An overvoltage event occurs when the power supply voltage exceeds the specified maximum voltage. Similarly, an undervoltage event occurs with the power supply voltage falls below the specified minimum voltage. An undervoltage event can cause the electronic device to malfunction. An overvoltage event can damage the electronic device.

SUMMARY

An over/undervoltage protection circuit uses a state machine to control threshold generation for over/undervoltage detection. The state machine prioritizes over/under voltage fault detection to provide increased threshold settling and comparison time. In one example, an over/under voltage protection circuit includes a voltage input terminal, a digital-to analog converter, a comparator, and a control circuit. The comparator includes a first input coupled to an output of the digital-to-analog converter, and a second input coupled to the voltage input terminal. The control circuit includes an output coupled to an input of the digital-to-analog converter, and an input coupled to an output of the comparator. The control circuit is configured to set the digital-to-analog converter to generate an overvoltage fault threshold responsive to the output of the comparator indicating that voltage of a signal at the voltage input terminal exceeds a threshold currently generated by the digital-to-analog converter.

In another example, a control circuit includes a state machine circuit. The state machine circuit is configured to transition from an overvoltage warning detection state to an overvoltage fault detection state responsive to receipt of a signal indicating that an input voltage exceeds an overvoltage warning threshold. The state machine is also configured to transition from an undervoltage warning detection state to the overvoltage fault detection state responsive to the signal indicating that the input voltage exceeds an undervoltage warning threshold. The state machine is further configured to transition from an undervoltage fault detection state to the overvoltage fault detection state responsive to the signal indicating that the input voltage exceeds an undervoltage fault threshold.

In an additional example, a method includes comparing an input voltage to a threshold voltage generated by a digital-to-analog converter. The digital-to-analog converter is set to generate an overvoltage fault threshold responsive to the input voltage exceeding the threshold voltage and the threshold voltage being an overvoltage warning threshold. The digital-to-analog converter is set to generate the overvoltage fault threshold responsive to the input voltage exceeding the threshold voltage and the threshold voltage being an undervoltage warning threshold. The digital-to-analog converter is set to generate the overvoltage fault threshold responsive to the input voltage exceeding the threshold voltage and the threshold voltage being an undervoltage fault threshold. The overvoltage fault threshold is greater than the overvoltage warning threshold. The overvoltage warning threshold is greater than the undervoltage warning threshold. The undervoltage warning threshold is greater than the undervoltage fault threshold.

In a further example, a computer system includes a processor, a power supply, and an over/under voltage protection circuit. The power supply is coupled to the processor. The over/under voltage protection circuit is coupled to the processor and the power supply. The an over/under voltage protection circuit includes a digital-to analog converter, a comparator, and a control circuit. The comparator includes a first input coupled to an output of the digital-to-analog converter, and a second input coupled to an output of the power supply. The control circuit includes an output coupled to an input of the digital-to-analog converter, and an input coupled to an output of the comparator. The control circuit is configured to set the digital-to-analog converter to generate an overvoltage fault threshold responsive to an input voltage at the second input of the comparator exceeding an overvoltage warning threshold at the first input of the comparator. The control circuit is also configured to set the digital-to-analog converter to generate the overvoltage fault threshold responsive to the input voltage at the second input of the comparator exceeding an undervoltage warning threshold at the first input of the comparator. The control circuit is further configured to set the digital-to-analog converter to generate the overvoltage fault threshold responsive to the input voltage at the second input of the comparator exceeding an undervoltage fault threshold at the first input of the comparator. The overvoltage fault threshold is greater than the overvoltage warning threshold. The overvoltage warning threshold is greater than the undervoltage warning threshold. The undervoltage warning threshold is greater than the undervoltage fault threshold.

BRIEF DESCRIPTION OF THE DRAWINGS

For a detailed description of various examples, reference will now be made to the accompanying drawings in which.

DETAILED DESCRIPTION

In this description, the term "couple" or "couples" may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Also, in this description, the recitation "based on" means "based at least in part on." Therefore, if X is based on Y, then X may be a function of Y and any number of other factors.

Figure 1:
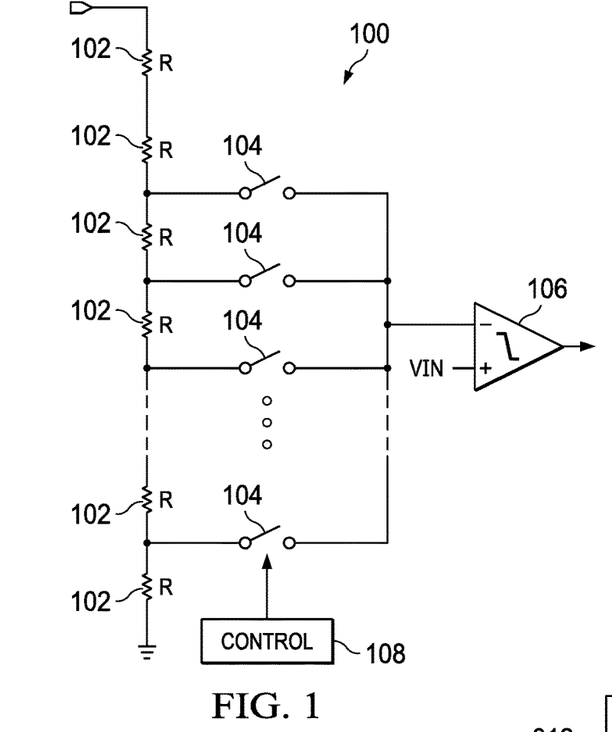
FIG. 1 shows a schematic diagram for an over/undervoltage protection circuit using series resistors and a single comparator.

Because overvoltage and undervoltage events affect the operation of an electronic system, quick detection of such events is desirable. Undervoltage may cause a system malfunction, while an overvoltage event may damage the system. To reduce the likelihood of damage, detection of overvoltage events may be prioritized over detection of undervoltage events. FIG. 1 shows a schematic diagram for an over/undervoltage protection circuit 100. The over/undervoltage protection circuit 100 includes resistors 102, switches 104, and a comparator 106. The resistors 102 are connected in series to form a multi-tap voltage divider. The switches 104 are coupled to taps of the voltage divider selected as threshold voltages for overvoltage or undervoltage detection. For example, a first tap is selected to provide an overvoltage fault threshold, a second tap is selected to provide an overvoltage warning threshold, a third tap is selected to provide an undervoltage warning threshold, and a fourth tap is selected to provide an undervoltage fault threshold. The control circuit 108 closes a selected one of the switches 104 to route threshold voltage to the comparator 106, and the comparator 106 compares an input voltage (VIN) to the selected threshold.

While capable of providing basic over/undervoltage detection, the over/undervoltage protection circuit 100 is subject to a number of issues. For example, as the detection range or resolution is increased, complexity of the over/undervoltage protection circuit 100 increases with the addition of resistors 102 and switches 104 to provide the range or resolution. Fault detection speed is a function of the delay of the comparator 106. Design of the comparator to meet the timing requirements of higher priority events results in overdesign and wasted resources with regard to lower priority events, which have less stringent detection and/or accuracy requirements. The over/undervoltage protection circuit 100 cannot be automatically calibrated to compensate for offset and other errors. Drift due to aging cannot be corrected, and resolution of any correction is limited to step size of the voltage divider formed by the resistors 102.

Figure 2:
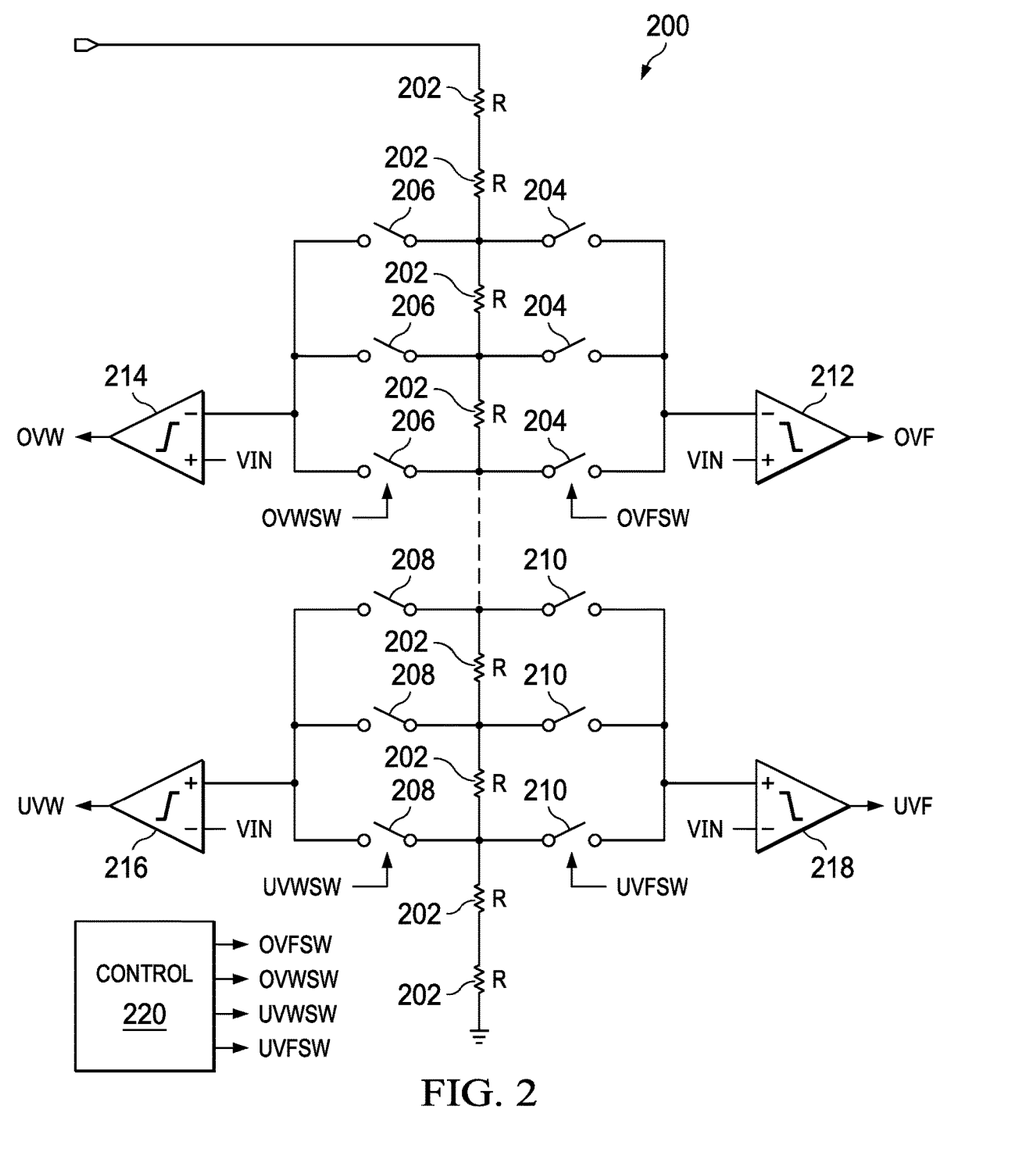
FIG. 2 shows a schematic diagram for an over/undervoltage protection circuit using series resistors and multiple comparators.

Because the output impedance of the voltage divider formed by the resistors 102 is high, to increase detection speed some implementations apply a dedicated comparator to detect each over/undervoltage range. FIG. 2 shows a schematic diagram for an over/undervoltage protection circuit 200 that includes a dedicated comparator for each over/undervoltage range. The over/undervoltage protection circuit 200 includes resistors 202, switches 204, 206, 208, and 210, comparators 212, 214, 216, and 218, and a control circuit 220. The resistors 202 are connected in series to form a multi-tap voltage divider. The switches 204 and the comparator 212 are coupled to the resistors 202 to detect an over voltage fault. The switches 206 and the comparator 214 are coupled to the resistors 202 to detect an overvoltage warning. The switches 208 and the comparator 216 are coupled to the resistors 202 to detect an undervoltage warning. The switches 210 and the comparator 218 are coupled to the resistors 202 to detect an undervoltage fault. The control circuit 220 closes one of the switches 204 to set the threshold for the overvoltage fault, closes one of the switches 206 to set the threshold for the overvoltage warning, closes one of the switches 208 to set the threshold for the undervoltage warning, and closes one of the switches 210 to set the threshold for the undervoltage fault.

While inclusion of dedicated comparators and switches allows the over/undervoltage protection circuit 200 to provide improved detection speed relative to the over/undervoltage protection circuit 100, a comparator and associated switches are added to the over/undervoltage protection circuit 200 for each additional event range to be detected. The number of switches needed to select the threshold for each event is a function of the detection range. As the range increases, the number of switches increases. Like the over/undervoltage protection circuit 100, the over/undervoltage protection circuit 200 cannot be automatically calibrated.

Figure 3:
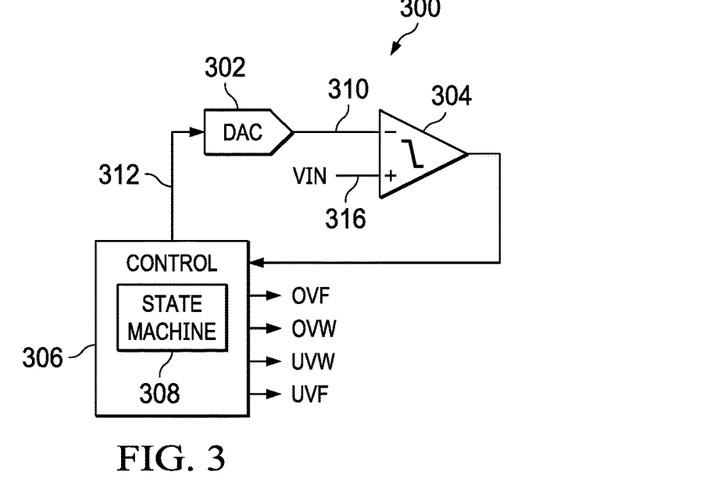
FIG. 3 shows a schematic diagram for an over/undervoltage protection circuit using a state machine to control a digital-to-analog converter.

FIG. 3 shows a schematic diagram for an over/undervoltage protection circuit over/undervoltage protection circuit 300 that uses a digital-to-analog converter to set the event thresholds. The over/undervoltage protection circuit 300 includes a digital-to-analog converter 302, a comparator 304, and a control circuit 306. The digital-to-analog converter 302 is coupled to the comparator 304 and provides the threshold voltage 310 to the comparator 304 for comparison to the input voltage 316 (VIN). The digital-to-analog converter 302 may include an R-2R resistor ladder. The control circuit 306 is coupled to the digital-to-analog converter 302 and provides a threshold value 312 to the digital-to-analog converter 302. The digital-to-analog converter 302 converts the threshold value 312 to the threshold voltage 310.

Figure 4:
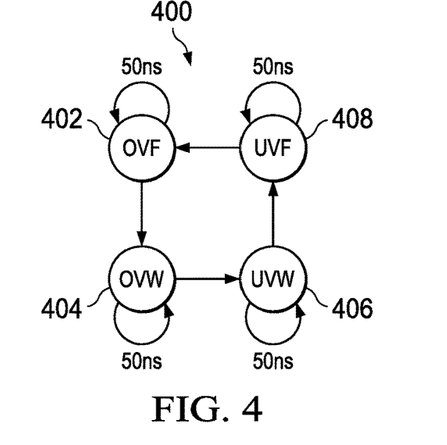
FIG. 4 shows a state diagram for operation of the over/undervoltage protection circuit of FIG. 3.

The control circuit 306 includes a state machine 308. The state machine 308 sets the threshold value 312 provided to the digital-to-analog converter 302. FIG. 4 shows a state diagram 400 for operation of the state machine 308. The state machine 308 successively transitions to, and assigns equal priority to, each detection state. In state 402 (OVF), the threshold value 312 sets the digital-to-analog converter 302 to generate the threshold voltage 310 as an overvoltage fault detection threshold, and the over/undervoltage protection circuit 300 checks for an overvoltage fault event. From state 402, the state machine 308 transitions to state 404. In state 404 (OVW), the threshold value 312 sets the digital-to-analog converter 302 to generate the threshold voltage 310 as an overvoltage warning detection threshold, and the over/undervoltage protection circuit 300 checks for an overvoltage warning event. From state 404, the state machine 308 transitions to state 406. In state 406 (UVW), the threshold value 312 sets the digital-to-analog converter 302 to generate the threshold voltage 310 as an undervoltage warning detection threshold, and the over/undervoltage protection circuit 300 checks for an undervoltage warning event. From state 406, the state machine 308 transitions to state 408. In state 408 (UVF), the threshold value 312 sets the digital-to-analog converter 302 to generate the threshold voltage 310 as an undervoltage fault detection threshold, and the over/undervoltage protection circuit 300 checks for an undervoltage fault event. From state 408, the state machine 308 transitions back to state 402 to check for an overvoltage fault event.

The over/undervoltage protection circuit 300 advantageously uses a single digital-to-analog converter 302 and comparator 304 to detect all over/under voltage events, and the digital-to-analog converter 302 allows for selection of a wide range of threshold voltages for each event, which allows the over/undervoltage protection circuit 300 to be used in a variety of applications and may reduce power consumption and circuit area.

The maximum for detection time for each event may differ in accordance with the potential effect of the event. For example, the over/undervoltage protection circuit 300 may need to detect an overvoltage fault event within 200 nanoseconds (ns) of onset, detect an overvoltage warning event within 400 ns of onset, and detect an undervoltage warning or undervoltage fault within method 800 ns of onset. Thus, the operation speed of the state machine 308 is determined by the maximum detection time of the overvoltage fault event. To meet the 200 ns detection time, the state machine 308 changes state every 50 ns. That is, time from onset to completion of each state of the state machine 308 is no more than 50 ns. Consequently, the digital-to-analog converter 302 and the comparator 304 are configured to settle within 50 ns, and implementations of the digital-to-analog converter 302 and the comparator 304 that provide such performance can require substantial circuit area and consume substantial power.

Figure 5:
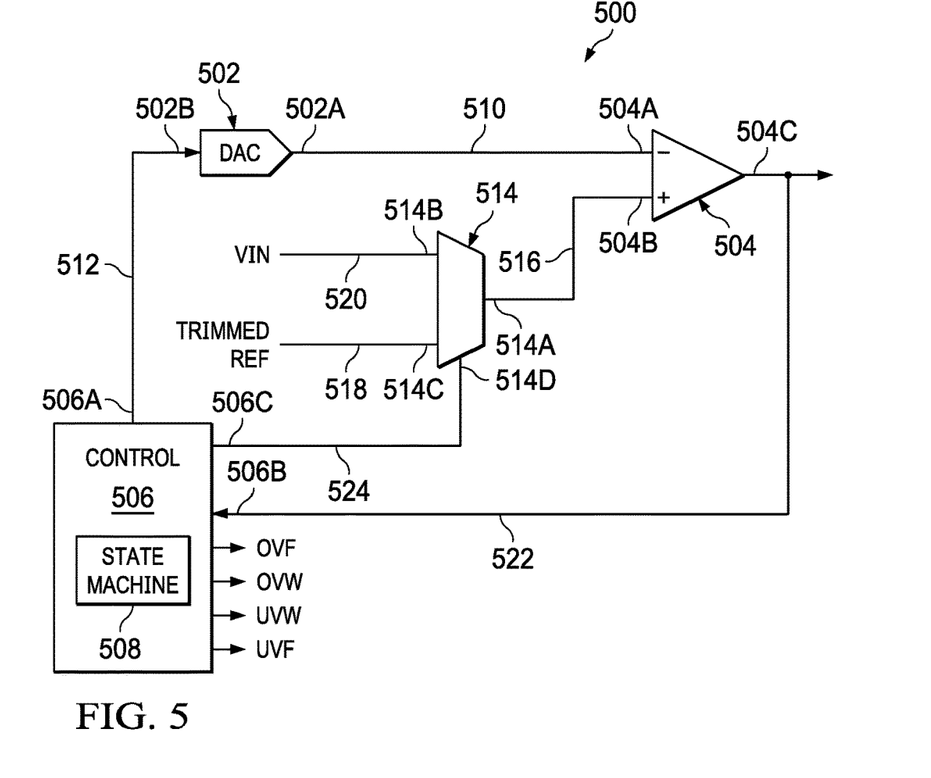
FIG. 5 shows a schematic diagram for an over/undervoltage protection circuit using a state machine that prioritizes overvoltage fault detection to control a digital-to-analog converter.

FIG. 5 shows a schematic diagram for an over/undervoltage protection circuit 500 that uses a state machine that prioritizes overvoltage fault detection. The over/undervoltage protection circuit 500 includes a digital-to-analog converter 502, a comparator 504, and a control circuit 506. The digital-to-analog converter 502 is coupled to the comparator 504 and provides the threshold voltage 510 to the comparator 504 for comparison to the input voltage 516. The result 522 of the comparison is provided to the control circuit 506. The control circuit 506 applies the result 522 to select state transitions as explained below. The digital-to-analog converter 502 may include an R-2R resistor ladder. The control circuit 506 is coupled to the digital-to-analog converter 502 and provides a threshold value 512 to the digital-to-analog converter 502. The digital-to-analog converter 502 converts the threshold value 512 to the threshold voltage 510. The input 504A of the comparator 504 is coupled to the output 502A of the digital-to-analog converter 502. The output 504C of the comparator 504 is coupled to the input 506B of the control circuit 506. The output 506A of the control circuit 506 is coupled to the input 502B of the digital-to-analog converter 502.

Figure 6:
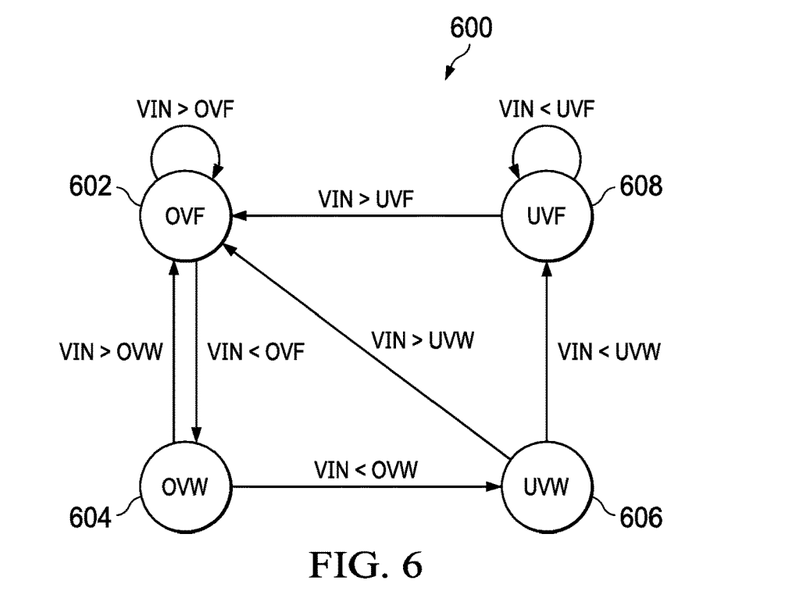
FIG. 6 shows a state diagram for operation of the over/undervoltage protection circuit of FIG. 5.

The control circuit 506 includes a state machine circuit 508. The state machine circuit 508 sets the threshold value 512 provided to the digital-to-analog converter 502. FIG. 6 shows a state diagram 600 for operation of the state machine circuit 508. The state diagram 600 shows that the state machine circuit 508 prioritizes overvoltage fault detection over detection of overvoltage warning events, undervoltage warning events, or undervoltage fault events. In the state diagram 600, at each state 602-608, the state diagram 600 transitions to the state 602 if the voltage at the input 504B of the comparator 504 exceeds the threshold voltage 510 at the input 504A of the comparator 504 (as indicated by the result 522). Thus, if VIN exceeds the applied threshold voltage 510 in any state, the control circuit 506 returns to the state 602 to check for an overvoltage fault event. By prioritizing overvoltage fault detection, the control circuit 506 is able to meet the 200 ns maximum overvoltage fault event detection specification while increasing the time spent in each state to 100 ns, thereby allowing for relaxation of the design requirements (e.g., propagation/settling time requirements) of the digital-to-analog converter 502 and the comparator 504.

In state 602 (overvoltage fault detection state (OVF)), the threshold value 512 sets the digital-to-analog converter 502 to generate the threshold voltage 510 as an overvoltage fault threshold, and the over/undervoltage protection circuit 500 checks for an overvoltage fault event. If the input voltage 516 exceeds the threshold voltage 510, then the state machine circuit 508 remains in the state 602. If the input voltage 516 is less than the threshold voltage 510, then from state 602, the state machine circuit 508 transitions to state 604. In state 604 (overvoltage warning detection state (OVW)), the control circuit 506 sets the digital-to-analog converter 502 to generate the threshold voltage 510 as an overvoltage warning threshold (overvoltage fault threshold>overvoltage warning threshold), and the over/undervoltage protection circuit 500 checks for an overvoltage warning event. If the input voltage 516 exceeds the threshold voltage 510, then the state machine circuit 508 transitions from the state 604 to the state 602. If the input voltage 516 is less than the threshold voltage 510, then from state 604, the state machine circuit 508 transitions to state 606. In state 606 (undervoltage warning detection state (UVW)), the control circuit 506 sets the digital-to-analog converter 502 to generate the threshold voltage 510 as an undervoltage warning threshold (overvoltage warning threshold>undervoltage warning threshold), and the over/undervoltage protection circuit 500 checks for an undervoltage warning event. If the input voltage 516 exceeds the threshold voltage 510, then the state machine circuit 508 transitions from the state 606 to the state 602. If the input voltage 516 is less than the threshold voltage 510, then from state 606, the state machine circuit 508 transitions to state 608. In state 608 (undervoltage fault detection state (UVF)), the control circuit 506 sets the digital-to-analog converter 502 to generate the threshold voltage 510 as an undervoltage fault threshold (undervoltage warning threshold>undervoltage fault threshold), and the over/undervoltage protection circuit 500 checks for an undervoltage fault event. If the input voltage 516 exceeds the threshold voltage 510, then the state machine circuit 508 transitions from the 608 to the 602. If the input voltage 516 is less than the threshold voltage 510, then the state machine circuit 508 remains in the state 608.

Some implementations of the over/undervoltage protection circuit 500 may allow for selective masking of the states 602-608 to further decrease detection time. For example, the over/undervoltage protection circuit 500 may be configured to skip or bypass one or more of the states 602-608 to reduce the overall detection time over all unmasked states.

The over/undervoltage protection circuit 500 may also include a multiplexer 514 coupled to the comparator 504. The multiplexer 514 selects the input signal VIN or a trimmed reference voltage 518 for provision to the comparator 504. The multiplexer 514 includes a selection input terminal 514 coupled to a calibration output terminal 506C of the control circuit 506. The multiplexer 514 includes an output 514A coupled to the input 504B of the comparator 504, an input 514B coupled to the voltage input terminal 520, and an input 514C coupled to a reference voltage source. At power-up initialization, or a user selected calibration time, the control circuit 506 activates the calibration signal 524 and applies the trimmed reference voltage 518 to calibrate for offset and gain errors caused by aging, process variation, or other factors. For example, offset is determined by identifying the input to the digital-to-analog converter 502 that produces an output most closely approximating the known trimmed reference voltage 518, where the difference in the voltage nominally produced by the input value to the digital-to-analog converter 502 and the trimmed reference voltage 518 is the offset. The control circuit 506 compensates for the measured offset in over/undervoltage detection. The calibration allows the specifications of the comparator 504 to be relaxed.

The over/undervoltage protection circuit 500 provides a number of advantages over the over/undervoltage protection circuit 100, the over/undervoltage protection circuit 200, and the over/undervoltage protection circuit 300. The over/undervoltage protection circuit 500 allows any value that the digital-to-analog converter 502 can produce to be used as a threshold for detection of any over/undervoltage event, which expands the number of applications in which the over/undervoltage protection circuit 500 can be used and allows for reduction of circuit complexity and power consumption. For example, the over/undervoltage protection circuit 500 provides resolution and range for over/undervoltage detection that would require four comparators and hundreds of switches in the over/undervoltage protection circuit 200. The calibration capability provided by the over/undervoltage protection circuit 500 increases the accuracy of over/undervoltage detection while allowing use of less a complex comparator.

Figure 7:
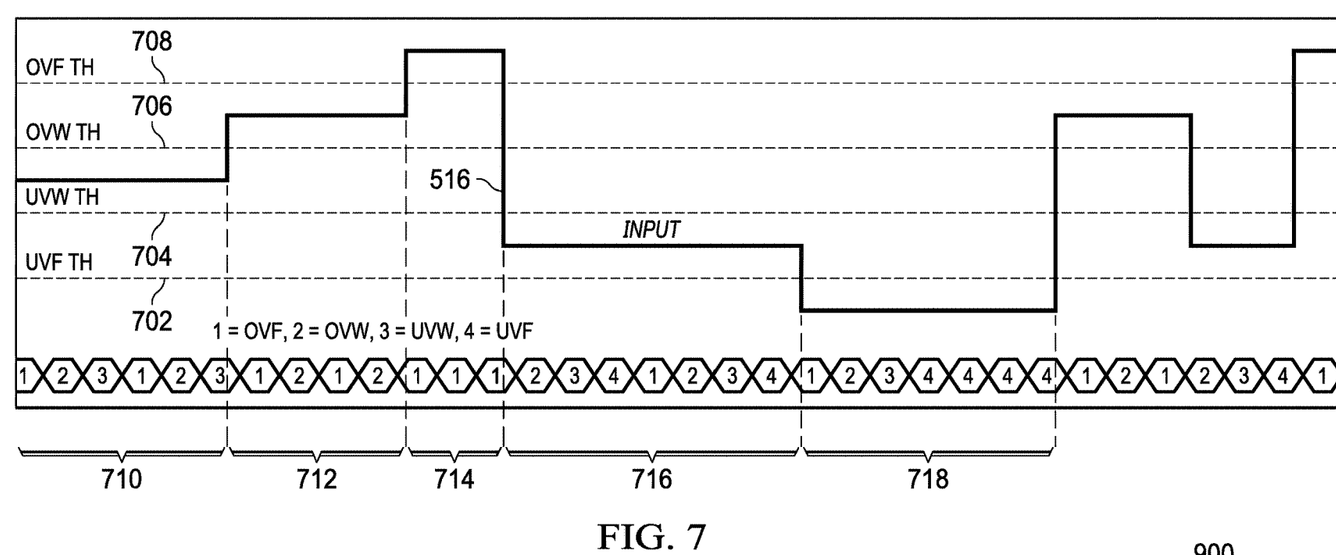
FIG. 7 shows operation of the over/undervoltage protection circuit of FIG. 5.

FIG. 7 shows operation of the over/undervoltage protection circuit 500. In the interval 710, the input voltage 516 is greater than the undervoltage warning threshold 704 and less than the overvoltage warning threshold 706. The state machine circuit 508 transitions from the state 602 to the state 604, to the state 606 and back to the state 602 because the input voltage 516 is greater than the undervoltage warning threshold 704.

In the interval 712, the input voltage 516 is greater than the overvoltage warning threshold 706 and less than the overvoltage fault threshold 708. The state machine circuit 508 transitions from the state 602 to the state 604, and back to the state 602 because the input voltage 516 is greater than the overvoltage warning threshold 706.

In the interval 714, the input voltage 516 is greater than the overvoltage fault threshold 708. The state machine circuit 508 stays in the state 602 because the input voltage 516 is greater than the overvoltage fault threshold 708.

In the interval 716, the input voltage 516 is greater than the undervoltage fault threshold 702 and less than the undervoltage warning threshold 704. The state machine circuit 508 transitions from the state 602 to the state 604 to the state 606 to the state 608, and back to the state 602 because the input voltage 516 is greater than the undervoltage fault threshold 702.

In the interval 718, the input voltage 516 is less than the undervoltage fault threshold 702. The state machine circuit 508 transitions from the state 602 to the state 604 to the state 606 to the state 608 and remains in the state 608 because the input voltage 516 is less than the undervoltage fault threshold 702.

Figure 8:
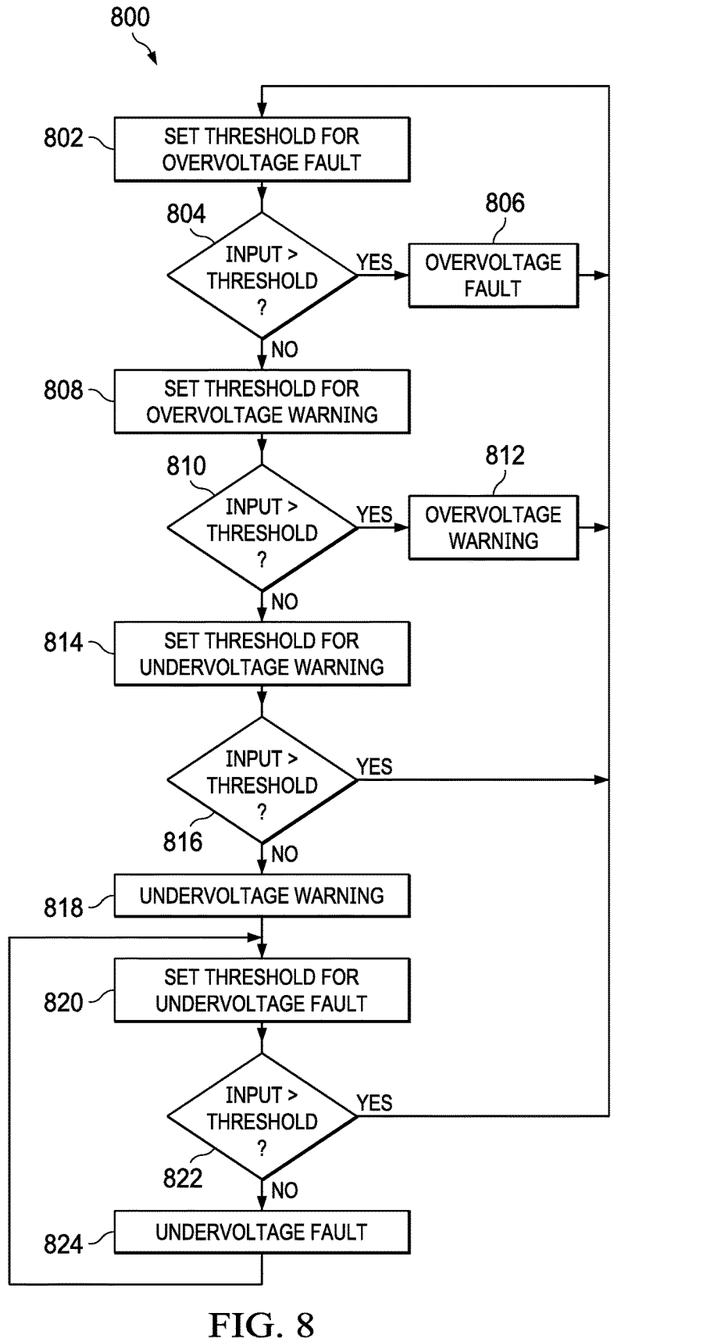
FIG. 8 shows a flow diagram for a method for over/undervoltage protection that prioritizes overvoltage fault detection.

FIG. 8 shows a flow diagram for a method 800 for over/undervoltage protection that prioritizes overvoltage fault detection. Though depicted sequentially as a matter of convenience, at least some of the actions shown can be performed in a different order and/or performed in parallel. Additionally, some implementations may perform only some of the actions shown. Operations of the method 800 may be performed by an implementation of the over/undervoltage protection circuit 500.

In block 802, the control circuit 506 sets the digital-to-analog converter 502 to generate a threshold voltage 510 for detecting an overvoltage fault.

In block 804, the comparator 504 compares the threshold voltage 510 and the input voltage 516. If the input voltage 516 is greater than the threshold voltage 510, then the control circuit 506 signals an overvoltage fault in block 806, and the method 800 continues in block 802.

If, in block 804, the input voltage 516 is not greater than the threshold voltage 510, then, in block 808, the control circuit 506 sets the digital-to-analog converter 502 generate a threshold voltage 510 for detecting an overvoltage warning.

In block 810, the comparator 504 compares the threshold voltage 510 and the input voltage 516. If the input voltage 516 is greater than the threshold voltage 510, then the control circuit 506 signals an overvoltage warning in block 812, and the method 800 continues in block 802.

If, in block 810, the input voltage 516 is not greater than the threshold voltage 510, then, in block 814, the control circuit 506 sets the digital-to-analog converter 502 generate a threshold voltage 510 for detecting an undervoltage warning.

In block 816, the comparator 504 compares the threshold voltage 510 and the input voltage 516. If the input voltage 516 is greater than the threshold voltage 510, then the method 800 continues in block 802.

If, in block 816, the input voltage 516 is not greater than the threshold voltage 510, then the control circuit 506 signals an undervoltage warning in block 818.

In block 820, the control circuit 506 sets the digital-to-analog converter 502 generate a threshold voltage 510 for detecting an undervoltage fault.

In block 822, the comparator 504 compares the threshold voltage 510 and the input voltage 516. If the input voltage 516 is greater than the threshold voltage 510, then the method 800 continues in block 802.

If, in block 816, the input voltage 516 is not greater than the threshold voltage 510, then the control circuit 506 signals an undervoltage fault in block 824, and the method 800 continues in block 820.

Because the method 800, performed by an implementation of the over/undervoltage protection circuit 500, uses a single digital-to-analog converter 502 and comparator 504 to detect all over/under voltage events, and the digital-to-analog converter 502 allows for selection of a wide range of threshold voltages for each event, the over/undervoltage protection circuit 500 can be used in a variety of applications having different ranges and resolutions. Use of a single digital-to-analog converter and comparator reduces power consumption and circuit area relative to circuits such as the over/undervoltage protection circuit 200. Calibration against a trimmed reference as provided by the over/undervoltage protection circuit 500 allows for relaxation of design specifications and increases detection accuracy. Prioritization of overvoltage faults, as implemented in the method 800, allows the state timing of the over/undervoltage protection circuit 500 to be relaxed, which reduces power consumption and simplifies circuit design.

Figure 9:
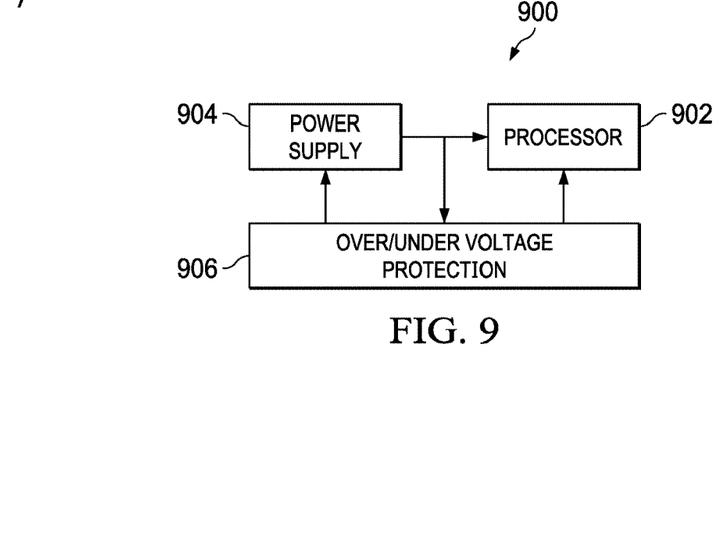
FIG. 9 shows a block diagram for a computer system that includes over/undervoltage protection in accordance with this description.

FIG. 9 show a block diagram for a computer system 900 that includes over/undervoltage protection in accordance with this description. The computer system 900 may be embodied in a server board or other computer implementation. The computer system 900 includes a processor 902, a power supply 904, and an over/undervoltage protection circuit 906. The over/undervoltage protection circuit 906 is an implementation of the over/undervoltage protection circuit 500. The processor 902 is a general-purpose microprocessor, a graphics processor, a digital signal processor, or other electronic device the executes instructions to perform a function. The power supply 904 generates the voltage the powers the processor 902. The power supply 904 may be a multi-phase buck converter or other switching power supply circuit configured to power the processor 902. The power supply 904 may generate multiple voltages in some implementations of the computer system 900.

The over/undervoltage protection circuit 906 compares the voltages generated by the power supply 904 to one or more thresholds to detect over/undervoltage events as described herein. To protect the processor 902, when an over/undervoltage event is detected, the over/undervoltage protection circuit 906 may signal the power supply 904 to adjust the voltage provided to the processor 902 and/or may signal the processor 902 to inform the processor 902 of the event. In some implementations of the computer system 900, the over/undervoltage protection circuit 906 may be incorporated in the power supply 904. For example, the over/undervoltage protection circuit 906 may be incorporated in a power supply controller of the power supply 904.

Because the over/undervoltage protection circuit 906 provides reduced power consumption and circuit area relative to other over/undervoltage protection circuit implementations, the overall circuit area and cost of the computer system 900 may be reduced relative to other implementations. Additionally, because the over/undervoltage protection circuit 906 includes calibration against a trimmed reference, accuracy of overvoltage/undervoltage event detection is improved relative to other implementations, which in turn better protects the processor 902 from damage or malfunction caused by an over/undervoltage event.

Modifications are possible in the described embodiments, and other embodiments are possible, within the scope of the claims.

What is claimed is:

1. An over/under voltage protection circuit, comprising:
   a digital-to analog converter;
   a comparator comprising:
      a first input coupled to an output of the digital-to-analog converter; and
      a second input configured to receive an input voltage; and
   a control circuit comprising:
      an output coupled to an input of the digital-to-analog converter; and
      an input coupled to an output of the comparator;
      wherein the control circuit is configured to set the digital-to-analog converter to output an overvoltage fault threshold responsive to the output of the comparator indicating that the input voltage exceeds any of an overvoltage warning threshold, an undervoltage warning threshold or an undervoltage fault threshold, the overvoltage fault threshold being greater than the overvoltage warning threshold, the overvoltage warning threshold being greater than the undervoltage warning threshold, and the undervoltage warning threshold being greater than the undervoltage fault threshold.

2. The over/under voltage protection circuit of claim 1, wherein the control circuit is configured to set the digital-to-analog converter to output an overvoltage warning threshold responsive to the input voltage being less than the overvoltage fault threshold.

3. The over/under voltage protection circuit of claim 1, wherein the control circuit is configured to set the digital-to-analog converter to output an undervoltage warning threshold responsive to the input voltage being less than an overvoltage warning threshold.

4. The over/under voltage protection circuit of claim 1, wherein the control circuit is configured to set the digital-to-analog converter to output an undervoltage fault threshold responsive to the input voltage being less than an undervoltage warning threshold.

5. The over/under voltage protection circuit of claim 1, further comprising a multiplexer comprising:
   a first input coupled to a voltage input terminal of the over/under voltage protection circuit;
   a second input coupled to a reference voltage source; and
   an output coupled to the second input of the comparator.

6. A control circuit, comprising:
   a state machine circuit configured to:
      transition from an overvoltage warning detection state to an overvoltage fault detection state responsive to receipt of a signal indicating that an input voltage exceeds an overvoltage warning threshold;
      transition from an undervoltage warning detection state to the overvoltage fault detection state responsive to the signal indicating that the input voltage exceeds an undervoltage warning threshold; and
      transition from an undervoltage fault detection state to the overvoltage fault detection state responsive to the signal indicating that the input voltage exceeds an undervoltage fault threshold;
   wherein the overvoltage warning threshold represents a higher voltage than the undervoltage warning threshold, and the undervoltage warning threshold represents a higher voltage than the undervoltage fault threshold;
   wherein an overvoltage fault threshold is greater than the overvoltage warning threshold; the overvoltage warning threshold is greater than the undervoltage warning threshold; and the undervoltage warning threshold is greater than the undervoltage fault threshold.

7. The control circuit of claim 6, wherein the state machine circuit is configured to transition from an overvoltage fault detection state to the overvoltage warning detection state responsive to the signal indicating that the input voltage is less than the overvoltage fault threshold.

8. The control circuit of claim 6, wherein the state machine circuit is configured to transition from the overvoltage warning detection state to the undervoltage warning detection state responsive to the signal indicating that the input voltage is less than the overvoltage warning threshold.

9. The control circuit of claim 6, wherein the state machine circuit is configured to transition from the undervoltage warning detection state to the undervoltage fault detection state responsive to the signal indicating that the input voltage is less than the undervoltage warning threshold.

10. The control circuit of claim 6, wherein the state machine circuit is configured to remain in the undervoltage fault detection state responsive to the signal indicating that the input voltage is less than the undervoltage fault threshold.

11. The control circuit of claim 6, wherein the state machine circuit is configured to remain in the overvoltage fault detection state responsive to the signal indicating that the input voltage exceeds an overvoltage fault threshold.

12. A method, comprising:
   comparing an input voltage to a threshold voltage generated by a digital-to-analog converter;
   setting the digital-to-analog converter to generate an overvoltage fault threshold responsive to the input voltage exceeding the threshold voltage and the threshold voltage being an overvoltage warning threshold;

setting the digital-to-analog converter to generate the overvoltage fault threshold responsive to the input voltage exceeding the threshold voltage and the threshold voltage being an undervoltage warning threshold; and setting the digital-to-analog converter to generate the overvoltage fault threshold responsive to the input voltage exceeding the threshold voltage and the threshold voltage being an undervoltage fault threshold;

wherein:
- the overvoltage fault threshold is greater than the overvoltage warning threshold;
- the overvoltage warning threshold is greater than the undervoltage warning threshold; and
- the undervoltage warning threshold is greater than the undervoltage fault threshold.

13. The method of claim 12, further comprising setting the digital-to-analog converter to generate the overvoltage warning threshold responsive to the input voltage being less than the overvoltage fault threshold.

14. The method of claim 12, further comprising setting the digital-to-analog converter to generate the undervoltage warning threshold responsive to the input voltage being less than the overvoltage warning threshold.

15. The method of claim 12, further comprising setting the digital-to-analog converter to generate the undervoltage fault threshold responsive to the input voltage being less than the undervoltage warning threshold.

16. A system, comprising:
a processor;
a power supply coupled to the processor; and
an over/under voltage protection circuit coupled to the processor and the power supply, and comprising:
  a digital-to analog converter;
  a comparator comprising:
    a first input coupled to an output of the digital-to-analog converter; and
    a second input coupled to an output of the power supply; and
  a control circuit comprising:
    an output coupled to an input of the digital-to-analog converter; and
    an input coupled to an output of the comparator;
    wherein the control circuit is configured to:
      set the digital-to-analog converter to output an overvoltage fault threshold responsive to an input voltage at the second input of the comparator exceeding an overvoltage warning threshold at the first input of the comparator;
      set the digital-to-analog converter to output the overvoltage fault threshold responsive to the input voltage at the second input of the comparator exceeding an undervoltage warning threshold at the first input of the comparator; and
      set the digital-to-analog converter to output the overvoltage fault threshold responsive to the input voltage at the second input of the comparator exceeding an undervoltage fault threshold at the first input of the comparator;
    wherein:
      the overvoltage fault threshold is greater than the overvoltage warning threshold;
      the overvoltage warning threshold is greater than the undervoltage warning threshold; and
      the undervoltage warning threshold is greater than the undervoltage fault threshold.

17. The system of claim 16, wherein the control circuit is configured to set the digital-to-analog converter to output the overvoltage warning threshold responsive to the input voltage being less than the overvoltage fault threshold.

18. The system of claim 16, wherein the control circuit is configured to set the digital-to-analog converter to output the undervoltage warning threshold responsive to the input voltage being less than the overvoltage warning threshold.

19. The system of claim 16, wherein the control circuit is configured to set the digital-to-analog converter to output the undervoltage fault threshold responsive to the input voltage being less than the undervoltage warning threshold.

* * * * *